(12) United States Patent
Chandhok et al.

(10) Patent No.: US 6,850,050 B2
(45) Date of Patent: Feb. 1, 2005

(54) RETICLE INSPECTION

(75) Inventors: Manish Chandhok, Portland, OR (US); Julian Montoya, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/155,428

(22) Filed: May 24, 2002

(65) Prior Publication Data

US 2003/0218471 A1 Nov. 27, 2003

(51) Int. Cl.[7] .............................................. G01N 27/00
(52) U.S. Cl. .................. 324/71.1; 716/19; 716/702; 716/78
(58) Field of Search ........................ 73/104; 250/306; 324/452, 456, 457, 458, 500, 501, 750, 751, 71.1; 716/19; 702/78

(56) References Cited

U.S. PATENT DOCUMENTS

| | | | | |
|---|---|---|---|---|
| 4,443,764 A | * | 4/1984 | Suh et al. | 324/456 |
| 5,028,866 A | * | 7/1991 | Wiese | 324/750 |
| 5,101,159 A | * | 3/1992 | Bossard et al. | 324/456 |
| 5,448,337 A | * | 9/1995 | Williams | 399/31 |
| 6,232,790 B1 | * | 5/2001 | Bryan et al. | 324/754 |
| 6,529,621 B1 | * | 3/2003 | Glasser et al. | 382/144 |
| 6,583,411 B1 | * | 6/2003 | Altmann et al. | 250/306 |

* cited by examiner

Primary Examiner—Anjan Deb
Assistant Examiner—Walter Benson
(74) Attorney, Agent, or Firm—Fish & Richardson P.C.

(57) ABSTRACT

An electric field is induced from a feature of a reticle, and the field is measured.

28 Claims, 5 Drawing Sheets

RETICLE INSPECTION

Reticles, also known in the semiconductor industry as photo masks, of the kind used for photolithography, for example (see FIG. 1, showing a fragment of a reticle 10), may be inspected before use to make sure that the pattern of features 12, 14 that has been formed in the chrome metal layer on surface 16 of the reticle correctly represents the intended design. Manufacturing defects that may be found by inspection include edge defects 18, pinholes 20, pindots 22, and peeling of an anti-reflective coating (ARC) 24 that is sometimes provided on the surface of the metal features.

If a defective reticle is used in production, the resulting devices may perform poorly or fail and capital equipment that relies on the reticle may be underutilized.

Typically inspection is done by projecting a focused light beam 30 through the reticle onto a CCD (charge-coupled device) array or other detector 32. By scanning the beam across the reticle, a fuzzy image 80 (FIG. 2) of the reticle features (FIG. 2) can be formed on the surface of the detector. Using computer techniques, the image can be enhanced and compared to an image of a reference reticle or to an image derived from the original reticle design data to detect flaws in the reticle.

DESCRIPTION

FIGS. 1, 3, and 7 show reticle inspection systems.

Reticle inspection can be performed automatically, rapidly, and at high resolution by inducing charge separation on the reticle conductive features and measuring low-intensity (low enough to avoid electrostatic discharge but high enough to be measured) static electric fields from features of the reticle.

Figure 1:
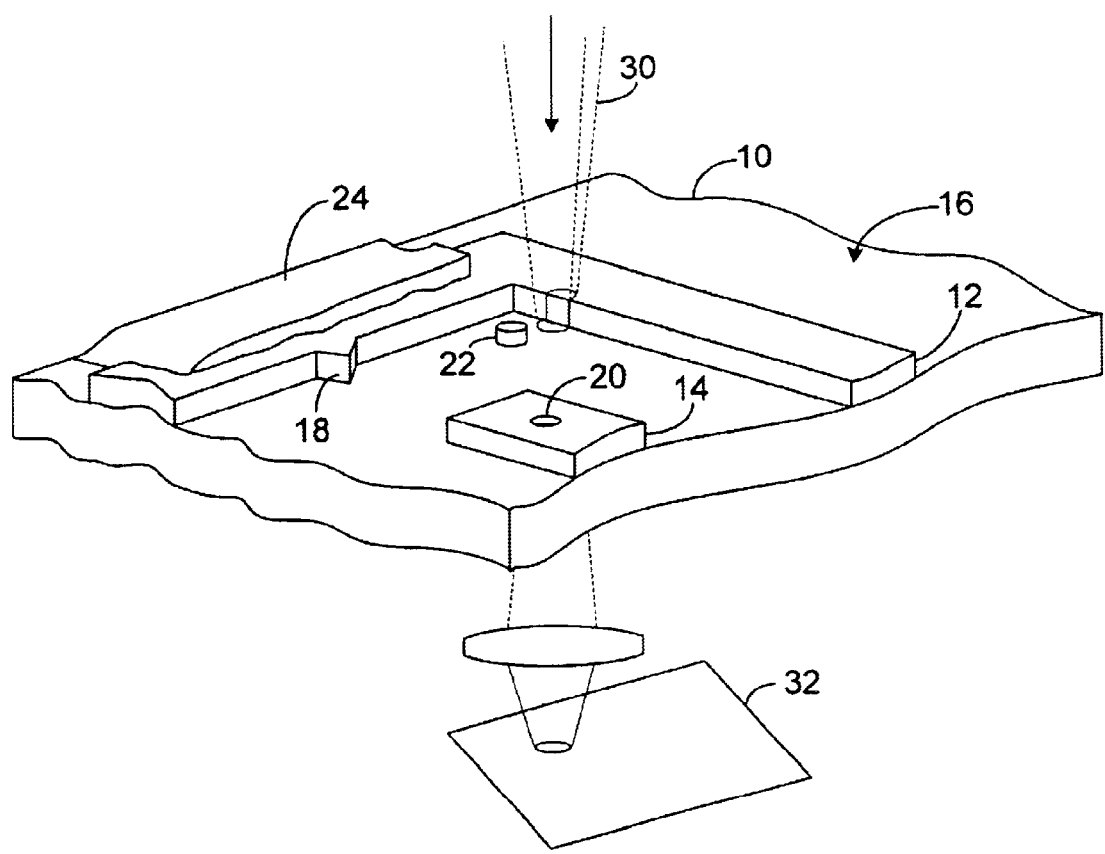
Figure 2:
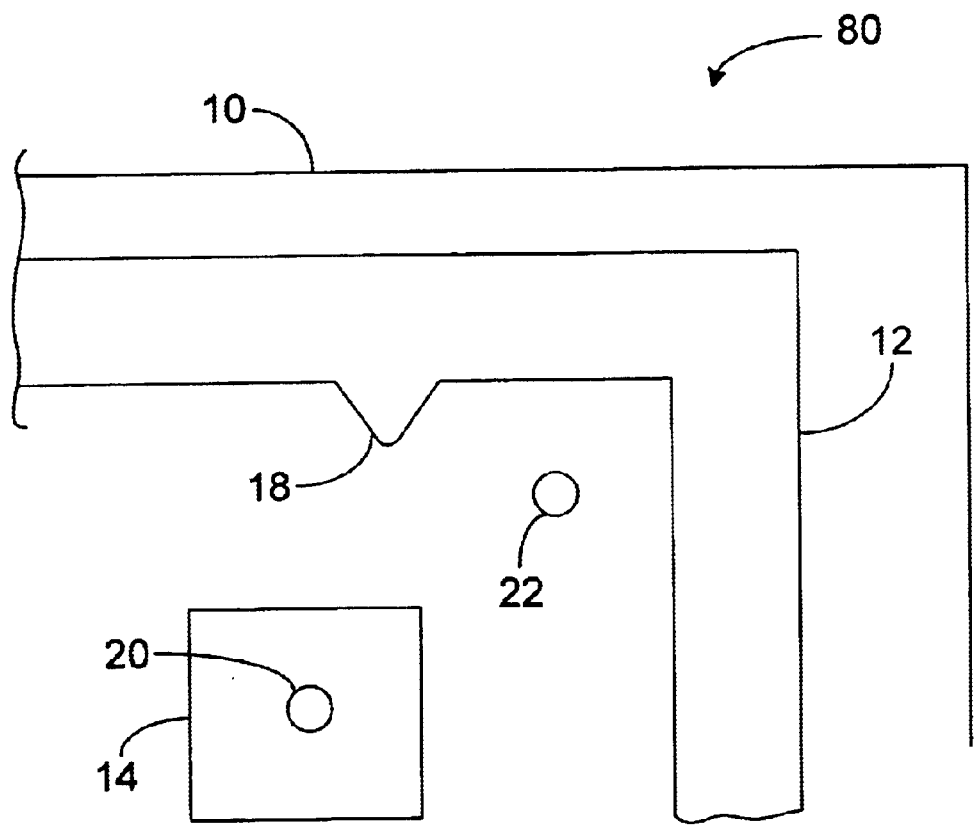
FIG. 2 shows a fragment of an image of a reticle.
Figure 3:
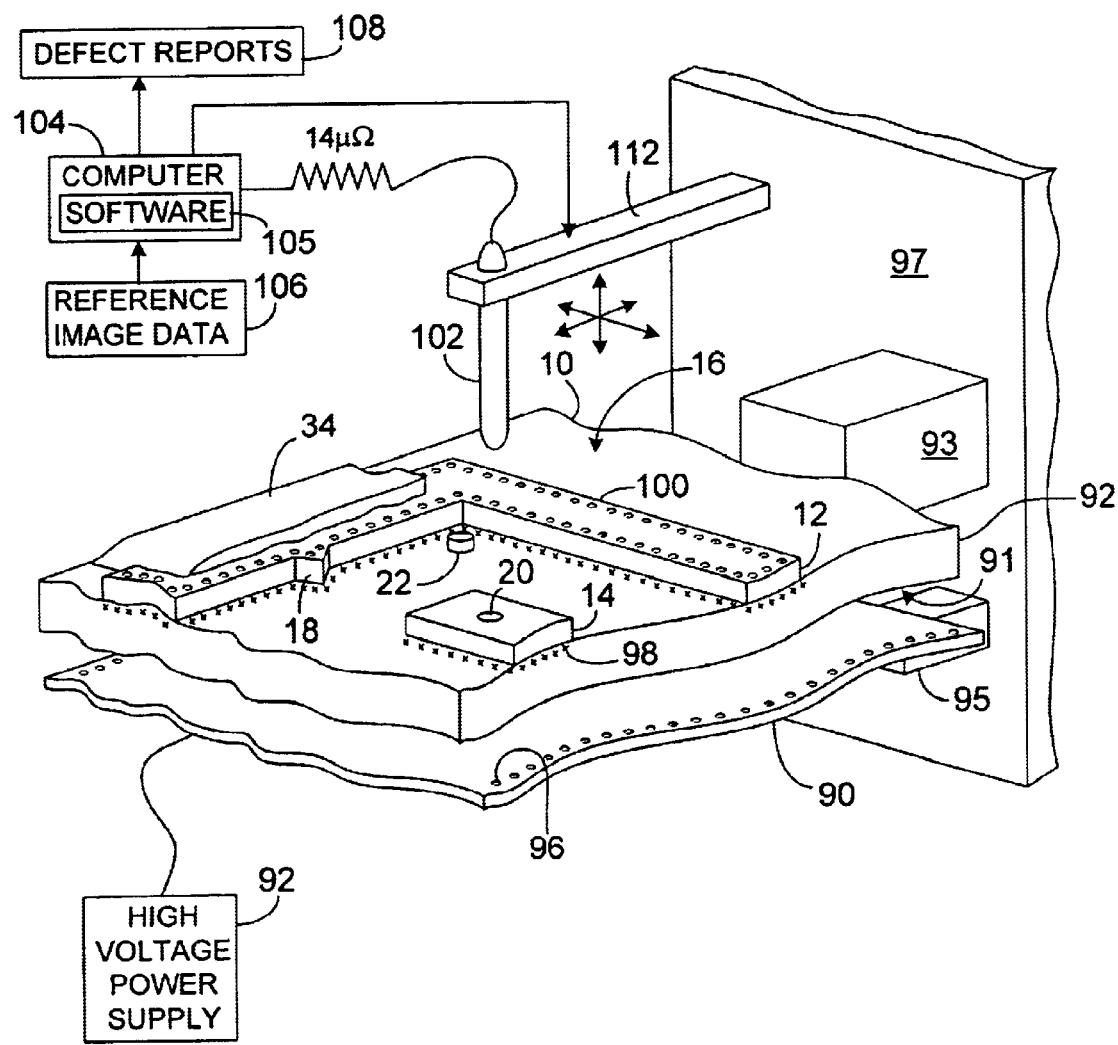

In some examples, as shown in FIG. 3, the electric fields may be generated using a conductive charge-coupling plate 90 that induces charge separation on the reticle conductive (e.g., chrome) structures. The charge-coupling plane is driven to a voltage by a DC power supply 92. The applied voltage is set so as not to exceed the spark gap potential between any elements of the system, typically less than 200V. Plate 90 may be positioned near the non-patterned side 91 of the quartz reticle body 92 and may extend across the full area of the non-patterned side 91.

The high voltage on plate 90, in this example assumed to be negative, causes an accumulation of (a) negative charges 96 along the perimeter of the upper surface of the plate, (b) positive charges 98 on the bottom surfaces of the metal features of the reticle, and (c) negative charges 100 along the edges of the upper surfaces of the reticle features 12 and 14. The negative charges on the upper surfaces of the reticle features repel one another forcing them to accumulate along the edges as shown. Thus the negative charges lie along lines that form a map of the edges of all of the features, whether intended to be there or not, that appear on the patterned surface of the reticle.

The map of the edges, and other details about the features, may be detected by an electric field detector probe 102 placed in the vicinity of the patterned surface 16 of the reticle. The probe detects the strength of the localized electric field generated by the charges accumulated in the locale near the tip of the probe. The local electric field is proportional in strength to the density of accumulated charges in that locale, as predicted by Gauss's law. The probe measures the field as a voltage generated in the probe. By scanning the probe across the patterned surface, differences in the local electric fields caused by differences in the charge densities (for example between an edge of a feature and the middle of the feature) may be detected.

The voltage signals from the probe are fed to a computer 104 that uses software 105 to form an image of the patterned surface of the reticle. The image may then be compared by the software with an image derived from reference image data 106 to identify defects and produce defect reports 108. The reference image data 106 may represent a good actual reticle or may represent the original design data for the reticle. The software can be programmed in any language and could be replaced by hardware or firmware or some combination of software, hardware, or firmware.

The detection of different kinds of defects may be done as follows. Edge defects that effectively increase the linear distance along the edge of a metallic feature of the reticle, may be detected because the line integrated charge density for a line with an edge defect will be larger than for a line without an edge defect. For pinhole defects, the charge densities around the hole will produce a higher electrical field within the chrome than would occur without such a hole. Pindots may be detected because they will have higher charge densities than the quartz areas around them.

The probe could be of the kind that is available commercially. The probe could be scanned automatically across the reticle by a robotic device 112 indicated schematically in FIG. 3, under the control, for example, of computer 104. The resolution (the smallest detectable defect) of the inspection is determined by the smallness of the tip of the probe, which is formed as a single-crystal silicon composition. Integrated circuit and micro-electro-mechanical structure (MEMS) fabrication techniques can be used to produce extremely small probe tips on the order of one-hundredth of a micrometer.

The level of the DC voltage on the plate 90, the configuration of the plate and detector, and their proximity to the reticle, and the ambient pressure are chosen so that electrostatic discharges do not occur between the reticle features and the probe or otherwise. The ambient can be air with a controlled amount of humidity, or another gas or gases including an inert environment (such as nitrogen), at a suitable pressure to prevent breakdown.

As shown schematically in FIG. 3, the robotic device 112 may be mounted on a structure 97. A reticle holder 93 and a plate holder 95 may also be mounted on the machine. The vertical distance between the plate and the reticle may be precisely controlled to generate appropriate electrical fields. The vertical distance between the probe or probe head and the reticle holder may also be adjustable to a precise amount to assure repeatable and accurate field measurements. The software in the computer may be configured to control the distances and to perform an automatic inspection cycle on a reticle, including moving the reticle, the plate, and the probe as needed to measure electrical fields at various parts of the reticle, accumulate the measurements, form an image of the reticle features, compare the image with a reference image and produce defect reports.

Figure 4:
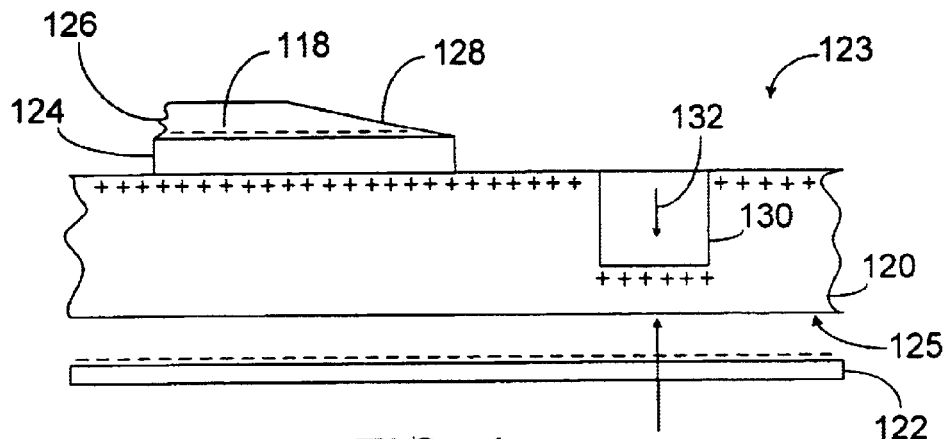
FIG. 4 shows a side view of a reticle.

As shown in FIG. 4, the electric charge 118 on the surface of a metal feature 124 of the reticle depends not only on the magnitude of the DC voltage, but on the plate 122, and also on the capacitance between the lower surface of the feature and the upper surface of the feature. The capacitance in turn depends on the dielectric constants and thickness of materials between the metal plate 122 and the patterned side 123. For that reason, the electric field measurement technique may also be used to detect the configurations of features and flaws that exhibit different thicknesses.

For example, as shown in FIG. 4, when an ARC 126, which is a dielectric, has a peeling defect 128, the effective thickness of the dielectric 126 is no longer constant. This difference in dielectric thickness between the underlying metal feature 124 and the probe tip yields different capacitances, and in turn different charge densities and electric field intensities that can be detected at the probe. Measuring the electric field variations enables a mapping of the ARC and its peeling defect.

In another approach, defects in the depth of a trench 130 etched into a phase-shifting mask (PSM) or a ternary PSM, for example, may also be detected because the depths of the trenches affect the effective dielectric thickness 132 of the quartz which in turn alters the measured electric field detected by the probe. Charges induced on the un-patterned side 125 of the quartz body of the reticle will be mirrored by charges that appear on the patterned side of the quartz body of the reticle even in regions that bear no metal features (The charges in those regions will not be mobile as they are in the metal features.).

Figure 5:
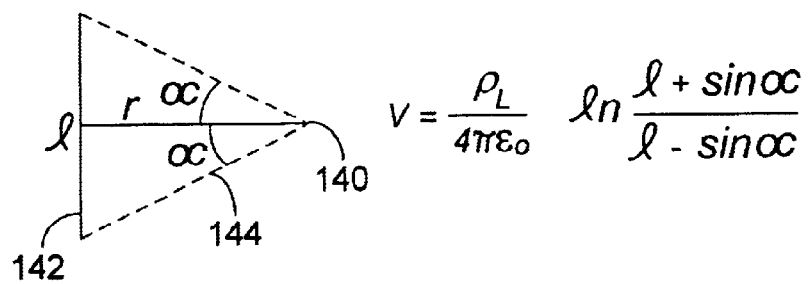
FIGS. 5 and 6 illustrate an effect of distance on measured voltage.
Figure 6:
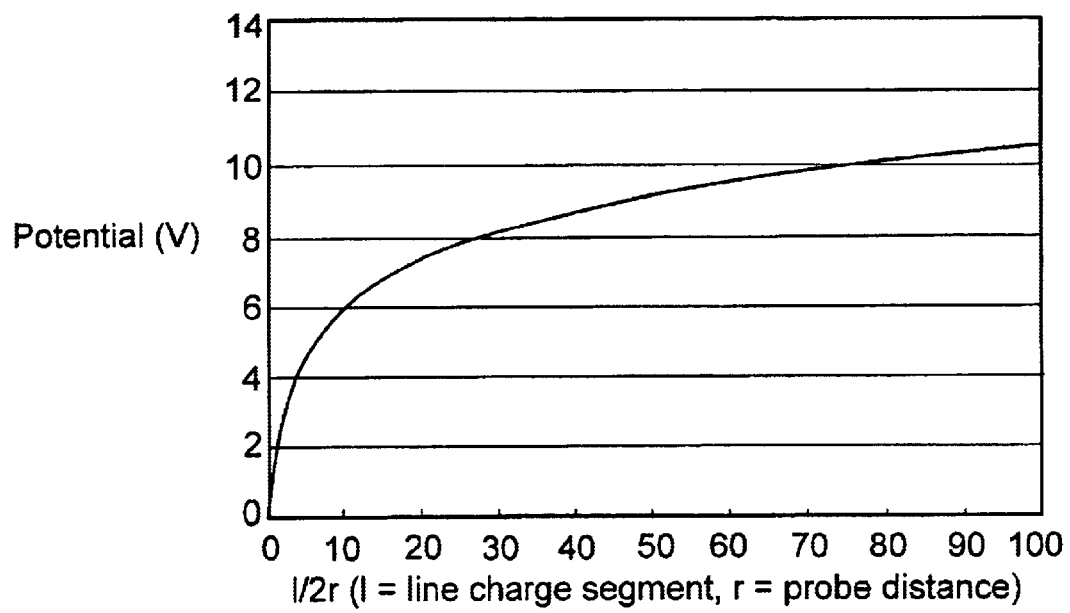

The electric field measurement technique requires precise control of the separation distance of the probe tip to the top of the reticle, especially for detecting ARC peeling. Probe placement errors (i.e., the distance of the probe from the reticle) in measuring small line segments can be as high as 25%. As shown in FIG. 5, the voltage V measured at a probe that is a distance r from the center of a line charge $\rho_L$ along a line segment (for example on an edge of a segment of a feature) of length 1 is a function of the angle $\alpha$, the segment length 1, and the charge. The graph of FIG. 6 shows the change in measured voltage as a function of the ratio of the line segment length 1 and the probe distance r. With short segments (associated with higher resolutions of measurement) the measured potential is more sensitive to probe distance. Thus, to accomplish high resolution testing, it is important to keep the probe at a constant distance from the reticle. This may be achieved by using a calibrated laser-driven (or a piezo-electric or capacitance gauge) distance detector.

Although some examples have been discussed above, other implementations are also within the scope of the following claims.

Figure 7:
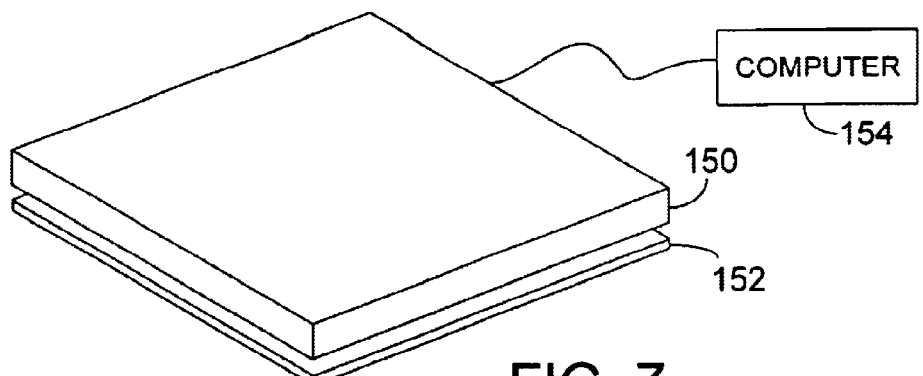

For example, instead of using a single probe and scanning it across the reticle, multiple probes or probe arrays may be used simultaneously as different locations, making the inspection quicker. As shown in FIG. 7, a two-dimensional array of probes can be formed as micro-electro-mechanical structures on a probe head 150. The probe head can be large enough to span the entire reticle 152 and positioned next to the reticle to permit an entire array of positions to be tested essentially simultaneously. The probe head could be driven from and read by a computer 154.

Any kind of feature on the reticle that would affect an electrical characteristic measured by the probe may be detected. When we use the word reticle we mean broadly to include any device or unit, whether or not a classic reticle, that can be inspected provided that it bears features and defects that affect the electrical characteristic measured at the probe. Any kind of device capable of inducing electrical fields on the features of the reticle could be used.

Among the benefits of the described measurement are one or more of the following. High resolution inspection can be achieved. The inspection can be done quickly. Features of a reticle that are not easily measured using optical techniques can be inspected.

Each element or feature that has been described or is claimed may be implemented in a variety of ways not limited to the ones that have been described.

We claim:

1. A method comprising inducing electric fields from features of a reticle, measuring the fields using a technique capable of providing information about a feature in a dimension orthogonal to the reticle surface, mapping the features of the reticle based on results of measuring the fields, and comparing results of the mapping with information about features of a reference reticle.

2. The method of claim 1 in which the inducing includes establishing a charge density at an edge of the feature.

3. The method of claim 1 in which at least one of the features comprises a defect.

4. The method of claim 3 in which the defect comprises an edge defect, a pinhole, or a pindot.

5. The method of claim 3 in which the defect comprises a peeled anti-reflective coating.

6. The method of claim 3 in which the defect comprises a flaw of a trench of a phase-shifting mask.

7. The method of claim 1 in which the fields are measured at probe tips each configured to measure an electric field independently of the other probe tips.

8. The method of claim 7 in which the probe tips are arranged in a two-dimensional array.

9. The method of claim 7 in which the probe tips are part of an integrated probe head.

10. The method of claim 7 in which the probe tips comprise micro-electro-mechanical structures.

11. The method of claim 1 in which the fields are measured automatically.

12. The method of claim 1 in which the measuring of the fields comprises scanning a probe tip across the reticle.

13. The method of claim 1 in which the features that are mapped are in a dimension normal to the reticle surface.

14. The method of claim 1 in which at least one of the features comprises distance along the dimension normal to the reticle surface.

15. The method of claim 1 in which the technique includes analyzing capacitance.

16. Apparatus comprising a structure configured to induce electrical fields, a holder configured to hold a reticle in a field inducing position relative to the structure, a probe configured to measure electrical fields induced from features of the reticle using a technique capable of providing information about a feature in a dimension orthogonal to the reticle surface, and a computational system configured to map features of the reticle based on results of measuring the fields and to compare the results of the mapping with information about features of a reference reticle.

17. The apparatus of claim 16 in which the structure comprises a metal plate.

18. The apparatus of claim 16 in which the probe comprises a probe tip.

19. The apparatus of claim 16 also including a high voltage power supply connected to the structure.

20. A system comprising
a structure configured to induce electrical fields,
a holder configured to hold a reticle in a field inducing position relative to the structure,
a probe configured to measure electrical fields induced from features of the reticle using a technique capable of providing information about a feature in a dimension orthogonal to the reticle surface,
a high voltage DC power supply connected to the structure, and
a machine adapted to receive measurements from the probe, map features of the reticle from the measurements, and compare the results of the mapping with information about features of a reference reticle.

21. The system of claim 20 in which the structure comprises a metal plate.

22. The system of claim 20 in which the probe comprises a probe tip.

23. A medium bearing instructions capable of causing a machine to:
induce an electric field from a feature of a reticle,
measure the field at a probe using a technique capable of providing information about a feature in a dimension orthogonal to the reticle surface,
map features of the reticle based on the results of measuring the field, and
compare the results of the mapping with information about features of a reference reticle.

24. The medium of claim 23 also capable of causing the machine to establish a charge density at an edge of the feature.

25. The medium of claim 23 in which the feature comprises a defect.

26. A medium bearing instructions capable of causing a machine to
automatically induce electric fields from features of a reticle,
automatically measure the induced electric fields using a technique capable of providing information about a feature in a dimension orthogonal to the reticle surface,
from measurements of the induced electrical fields, automatically map features of the reticle,
automatically compare the results of the mapping to information about features of a reference reticle, and
generate a report of results of the comparing.

27. The medium of claim 26 in which the measurements are made simultaneously at multiple locations on the reticle.

28. The medium of claim 26 in which the features include defects and the report identifies the defects.

* * * * *